United States Patent [19]

Mimura

[11] Patent Number: 5,336,949
[45] Date of Patent: Aug. 9, 1994

[54] LOGIC CIRCUIT WITH ENHANCEMENT TYPE FET AND SCHOTTKY GATE

[75] Inventor: Takashi Mimura, Kawasaki, Japan

[73] Assignee: Fujitsu Limited, Kawasaki, Japan

[21] Appl. No.: 924,948

[22] Filed: Aug. 5, 1992

[30] Foreign Application Priority Data

Aug. 20, 1991 [JP] Japan .................. 3-208291

[51] Int. Cl.⁵ .................. H03K 19/017; H03K 19/094
[52] U.S. Cl. .................. 307/448; 307/450; 307/478; 307/482.1
[58] Field of Search .................. 307/448, 450, 303.2, 307/482.1, 478, 304, 270, 475

[56] References Cited

U.S. PATENT DOCUMENTS

| 4,145,624 | 3/1979 | Upadhyayula | 307/450 |
| 4,639,621 | 1/1987 | Ikawa et al. | 307/304 |
| 4,724,342 | 2/1988 | Sato et al. | 307/304 |
| 4,853,561 | 8/1989 | Gravrok | 307/450 |
| 4,931,669 | 6/1990 | Higashisaka | 307/450 |

*Primary Examiner*—Edward P. Westin
*Assistant Examiner*—Richard Roseen
*Attorney, Agent, or Firm*—Staas & Halsey

[57] ABSTRACT

A logic circuit comprising an inverter which includes a load element connected at its one end to a high-potential power supply, an enhancement type N-channel field-effect transistor having a Schottky gate, the transistor being connected at its drain to another end of the load element and at its source to a low-potential power supply, an input terminal, and a gate-current control unit having negative resistance characteristic, the unit being provided between the input terminal and a gate of the enhancement type N-channel field-effect transistor for controlling a gate current that flows through the enhancement type N-channel field-effect transistor.

11 Claims, 12 Drawing Sheets ($V_F \simeq V_{OH}$)

F I G. 4
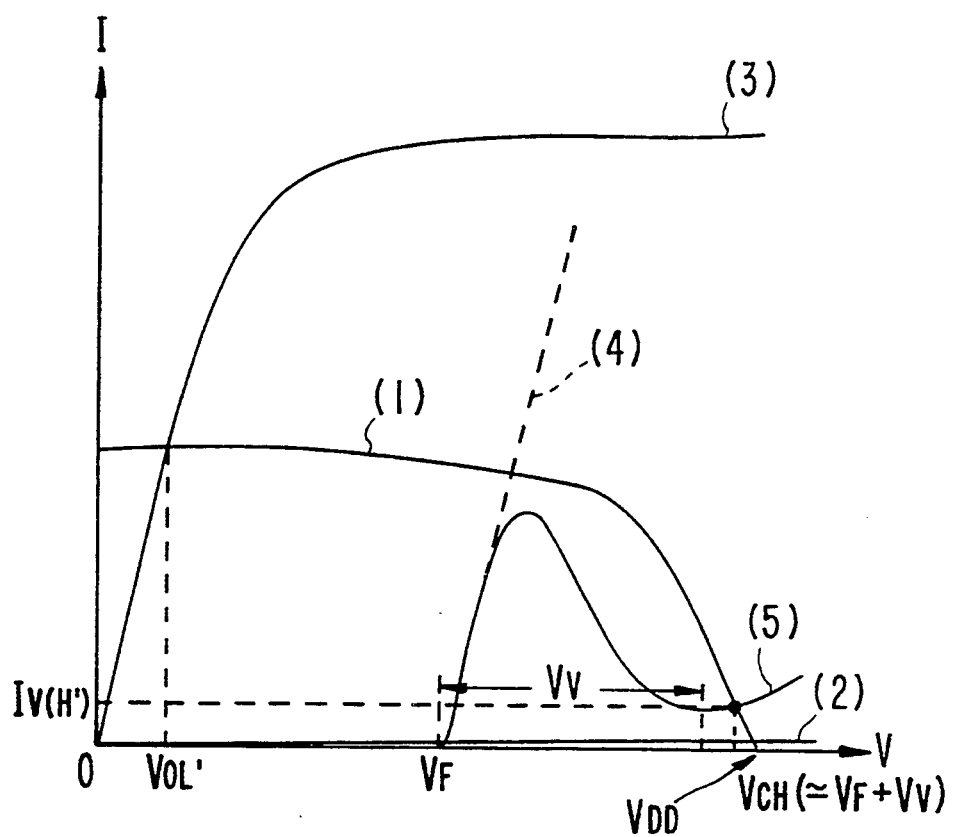

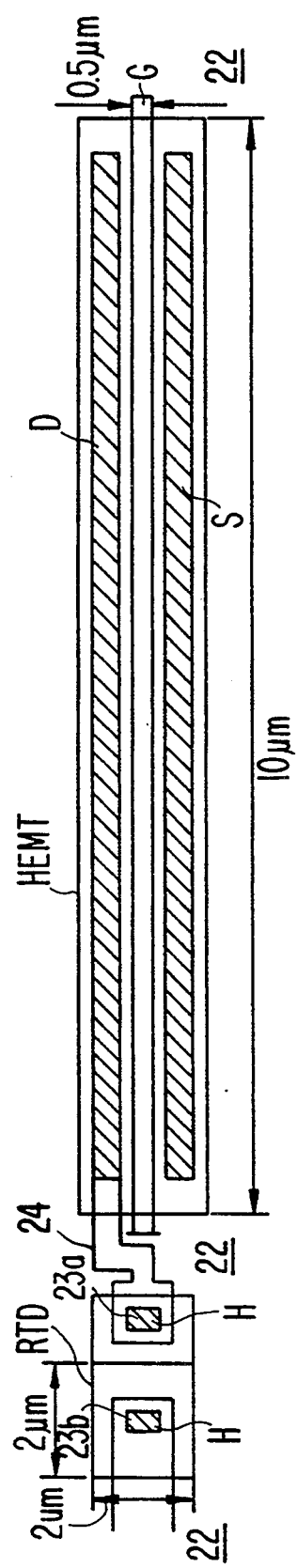

LOGIC CIRCUIT WITH ENHANCEMENT TYPE FET AND SCHOTTKY GATE

FIELD OF THE INVENTION

The present invention relates to an improvement in the operating characteristics of a logic circuit that uses a field-effect transistor (FET) having a Schottky gate.

STATE OF THE PRIOR ART

In a logic circuit that uses an enhancement type N-channel FET having a Schottky gate, it has recently been required to reduce power consumption and to increase the logic amplitude and the noise margin of the logic circuit output signal.

A conventional logic circuit of the above kind, for example, comprises a noninverter circuit 31 such as that shown in FIG. 1. The noninverter circuit 31 includes a first stage inverter 32a and a second stage inverter 32b (hereinafter, the first inverter 32a and the second inverter 32b, respectively). The first inverter 32a has a depletion type N-channel FET 33a with a Schottky gate, and an enhancement type N-channel FET 34a with a Schottky gate. The FETs 33a and 34a are connected in series between a high-potential power supply $V_{DD}$ and a low-potential power supply $V_{SS}$. Likewise, the second inverter 32b has a depletion type N-channel FET 33b with a Schottky gate, and an enhancement type N-channel FET 34b with a Schottky gate. The connection point, or node, B between the N-channel FETs 33a and 34a of the first inverter 32a is connected to the gate of the FET 34b of the second invert 32b. A current $I_{D1}$ that flows through the depletion type N-channel FET 33a of the first inverter 32a is set so that the voltage level of the node B, as the first inverter 32a outputs a logic low, becomes lower than the threshold voltage $V_{TH}$ of the enhancement type N-channel FET 34b of the second inverter 32b.

In the construction described above, if a high logic signal voltage is applied from an input terminal A, the enhancement type N-channel FET 34a of the first inverter 32a will be on and a low logic signal voltage will be outputted from the first inverter 32a, at node B, to the gate of the enhancement type N-channel FET 34b of the second inverter 32b. The FET 34b of the second inverter 32b is then turned off and the second inverter 32b outputs a high logic signal voltage.

If, on the other hand, a low logic signal voltage is applied from the input terminal A, the enhancement type N-channel FET 34a of the first inverter 32a will be off and a high logic signal voltage will be outputted from the first inverter 32a at node B to the gate of the enhancement type N-channel FET 34b of the second inverter 32b. The FET 34b of the second inverter 32b is then turned on and the second inverter 32b outputs a low logic signal voltage from node B' and thus to the output terminal X.

The conventional logic circuit described above has the following disadvantages, because it is constructed such that the FETs in a Si-CMOS type circuit are simply replaced with high-speed compound semiconductor devices such as GaAs-MESFETs and HEMTs (High Electron Mobility Transistors). That is, for example, when a low logic signal voltage is applied from the input terminal A, a gate current $I_G$ shown in FIG. 1 will flow because the high-speed compound semiconductor devices, such as GaAsMESFETs and HEMTs, have Schottky gates. Because of this gate current $I_G$, there are the disadvantages that a logic amplitude is reduced, a noise margin is deteriorated, and power consumption is increased.

The disadvantages associated with the conventional circuit of FIG. 1 will hereinafter be described in detail in conjunction with FIG. 2. In FIG. 2, (1) represents the load curve of the depletion type N-channel FET 33a of the first inverter 32a, (2) represents the I-V characteristic of the enhancement type N-channel FET 34a at its low level state, (3) represents the I-V characteristic of the enhancement type N-channel 34a at its high level state, and (4) represents the I-V characteristic of the enhancement type N-channel FET 34b of the second inverter 32b in the forward direction.

As shown in FIG. 2, the intersecting point between the load curve (1) of the FET 33a and the I-V characteristic (3) of the enhancement type N-channel FET 34a at its high level state represents a voltage level $V_{OL}$ at node B when the first inverter 32a outputs a low level logic signal voltage, and also represents a value of current $I_{L1}$ that flows through the depletion type N-channel FET 33a at that time. Likewise, the intersecting point between the load curve (1) of the FET 33a and the I-V characteristic (4) of the FET 34b represents a voltage level $V_{OH}$ at node B' when the first inverter 32a outputs a high logic signal voltage, and also represents a value of current that flows through the depletion type N-channel FET 33a at that time.

Note that even if the output high signal voltage $V_{OH}$ of the first inverter 32a is higher than the forward current rising voltage $V_F$ of the Schottky gate of the enhancement type N-channel FET 34b of the second inverter 32b, the forward voltage $V_F$ becomes nearly the same as the output voltage $V_{OH}$ because a voltage greater than the voltage $V_F$ is clamped by the Schottky diode in the Schottky gate of FET 34b. The value of this forward voltage $V_F$ depends on the characteristics of specific devices and is about 0.4 V for a SiMESFET, about 0.6 V for a GaAsMESFET, and about 0.8 V for a HEMT (High Electron Mobility Transistor).

A logic amplitude is represented by $V_F$-$V_{OL}$ (0.1 V to 0.2 V), so the logic amplitudes for a SiMESFET, a GaAsMESFET and for a HEMT will be 0.2 V to 0.3 V, 0.4 V to 0.5 V, and 0.6 V to 0.7 V, respectively. Therefore, these logic amplitudes are reduced to about one-tenth of the typical logic amplitudes of 3 V to 5 V for a standard SiCMOS circuit, and noise margins are also deteriorated due to the logic amplitude reduction.

The electric power of the enhancement type N-channel FET 34b of the second inverter 32b that is consumed during stand-by time (i.e., when an input low logic signal voltage is applied from the input terminal A) is $V_F \cdot I_{L1}$ and is substantially the same as the electric power consumption of FET 34b, $V_{DD} \cdot I_{L1}$, that occurs when an input high logic signal voltage is applied from the input terminal A. In large scale integrated circuits, such an increase in power consumption during stand-by time is an important problem.

It is, accordingly, an important object of the present invention to provide a logic circuit which is capable of decreasing power consumption and increasing the logic amplitude and the noise margin of the logic output signal of the logic circuit.

SUMMARY OF THE INVENTION

The foregoing objects are accomplished in accordance with the present invention by providing a logic circuit 1 comprising a first inverter 2 shown in FIG. 3. The first inverter 2 includes a load element 3 connected at a first end to a high-potential power supply $V_{DD}$, and an enhancement type N-channel field-effect transistor 4 having a Schottky gate. The enhancement type N-channel field-effect transistor 4 is connected at its drain to a second end of the load element 3 and at its source to a low-potential power supply $V_{SS}$. The first inverter 2 further includes an input terminal and a gate-current control element 5 having a negative resistance characteristic. The element 5 is provided between the input terminal A and a gate of the enhancement type N-channel field-effect transistor 4 for controlling the level of the gate current that flows through the enhancement type N-channel field-effect transistor 4.

In the present invention, the gate current control element 5 is connected to the gate of the enhancement type N-channel field-effect transistor 4 thereby to change the current-voltage characteristic of the transistor 4 in the forward direction. As shown in FIG. 4, the intersecting point between the load curve (1) of the load element 3 and the resultant current-voltage characteristic (5) of the transistor 4, under control of the gate-current control element 5, is shifted to a higher voltage position $V_{OH'}$ and to a lower current position, as compared with those corresponding voltage and current positions of the conventional circuit of FIG. 2. This means that the level of the gate current flowing through the transistor 4 is reduced. As a result, power consumption is decreased, and the logic amplitude and the noise margin are increased, relatively to the conventional circuit of FIG. 2.

The aforementioned logic circuit according to the present invention may further comprise a second inverter connected to said first inverter, as shown in FIG. 5. The aforementioned gate-current control elements of FIG. 3 in the case of FIG. 5, may comprise corresponding elements 5a and 5b, each labelled N and each of which may comprise a resonant tunneling diode (RTD) or an Esaki diode. The aforementioned load element 3 of FIG. 3, and the corresponding elements 3a and 3b in FIG. 5, each may comprise a depletion type N-channel field-effect transistor having a Schottky gate, or a resonant tunneling diode.

BRIEF DESCRIPTION OF THE DRAWINGS

The drawbacks of a prior-art logic circuit and the features and advantages of a logic circuit according to the present invention will be more clearly understood from the following description taken in conjunction with the accompanying drawings in which:

FIG. 4 is a graph showing the respective current-voltage characteristics of the load element and the enhancement type N-channel FET of FIG. 3;

FIG. 12 is an enlarged plan view, similar to that of FIG. 7, in which the RTD is connected to the drain of an FET in accordance with yet a further embodiment of the invention.

DESCRIPTION OF THE PREFERRED EMBODIMENTS

Figure 5:
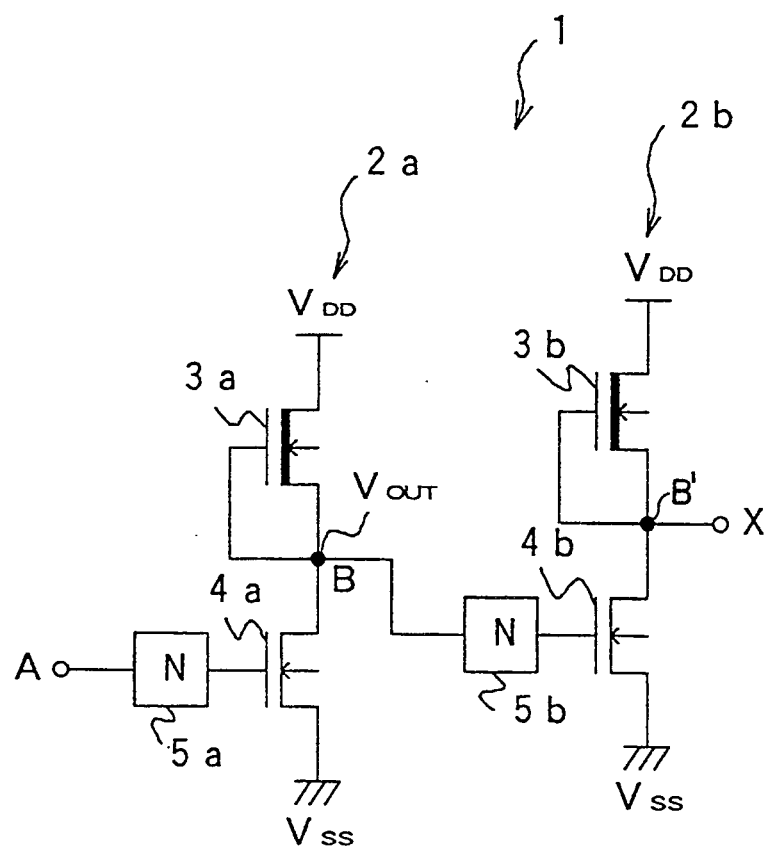
FIG. 5 is a circuit schematic of an embodiment of the present invention.

Referring to FIG. 5, there is shown a preferred embodiment of a logic circuit in accordance with the present invention. The logic circuit comprises a noninverter circuit 1 including a first inverter 2a and a second inverter 2b. The first inverter 2a comprises a depletion type HEMT (High Electron Mobility Transistor) 3a with a Schottky gate and an enhancement type HEMT 4a with a Schottky gate. The HEMTs 3a and 4a are connected in series between a high-potential power supply $V_{DD}$ and a low-potential power supply $V_{SS}$. Likewise, the second inverter 2b comprises a depletion type HEMT 3b with a Schottky gate and an enhancement type 4b with a Schottky gate. A first RTD (Resonant Tunneling Diode) 5a is provided between the input terminal A of the first inverter 2a and the gate of the HEMT 4a. A second RTD 5b is provided between the output terminal, or node, B of the first inverter 2a and the gate of the HEMT 4b of the second inverter 2b.

Figure 6A:
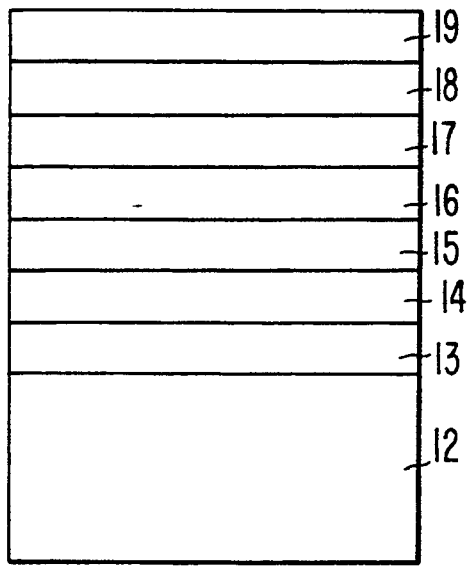
FIGS. 6(a)–6(d) are diagrams showing processes for fabricating an integrated device comprising a RTD and a HEMT.

FIGS. 6(a)–6(d) schematically illustrate processes for fabricating an integrated device comprising a RTD and an enhancement type HEMT which are mounted on the same substrate. FIG. 6(a) shows the cross section of an epitaxial layer in accordance with the present invention. In the figure, reference numeral 12 indicates an InP substrate. On the InP substrate 12, there are formed an undoped InGaAs layer 13 having a film thickness of about 200 Å, an AlInAs electron supplying layer 14 having a film thickness of about 300 Å and a doping concentration of $2 \times 10^{18}$ cm$^{-3}$, an InGaAs layer 15 having a film thickness of about 500 Å and a doping concentration of $4 \times 10^{18}$ cm$^{-3}$, an AlInAs barrier layer 16 having a film thickness of about 47 Å, an InGaAs layer 17 having a film thickness of about 32 Å, an AlInAs barrier layer 18 having a film thickness of about 47 Å, and an InGaAs layer 19 having a film thickness of about 500 Å and a doping concentration of $4 \times 10^{16}$ cm$^{-3}$.

Figure 6B:
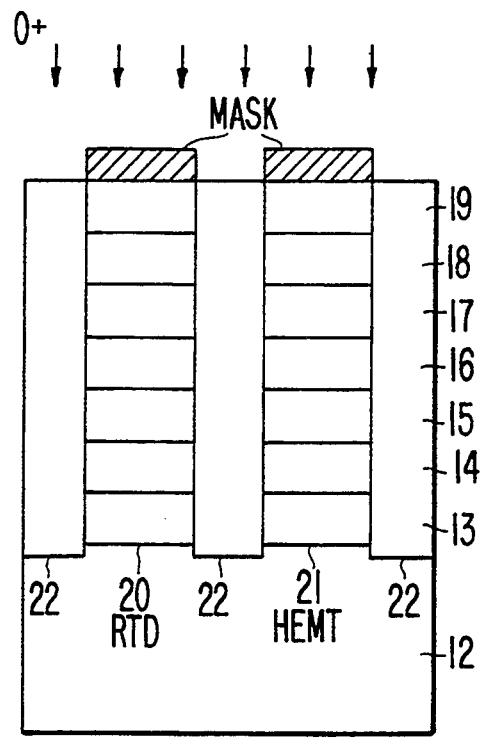
Figure 6C:
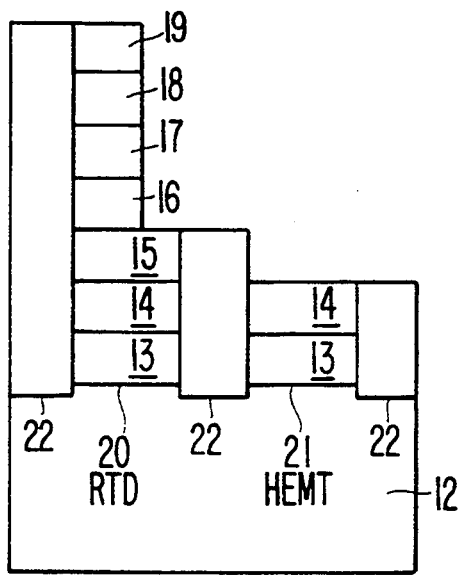
Figure 6D:
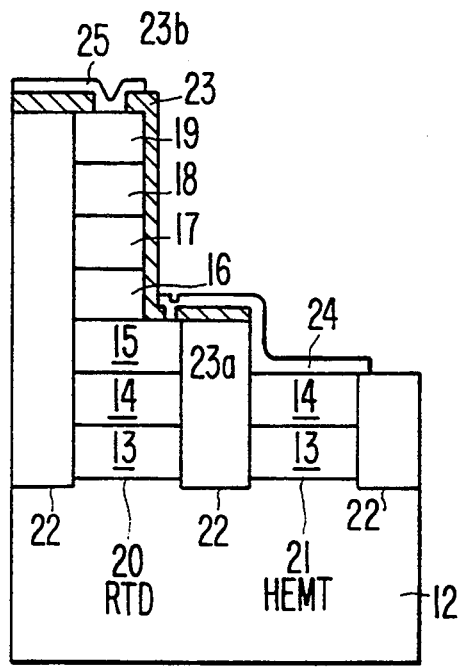

As shown in FIG. 6(b), an RTD region 10 and a HEMT region 21 are defined by semi-insulating isolation regions 22 which are formed by $0^+$ ion implantation. Then, the corresponding layers 15–19 of the HEMT region 21 are removed by etching, and corresponding parts of the layers 16–19 of the RTD region 20 are also removed by etching, as shown in FIG. 6(c). In FIG. 6(d), a SiON film (layer-to-layer insulating film)

23 is formed on the RTD region 20 and the adjacent semi-insulating regions 22, a gate metal layer 24 is formed on, and so as to provide a connection between, the RTD region 20 and the HEMT region 21, extending through a window 23a in the SiON layer 24 to contact layer 15 of the RTD region 20, and a wire metal layer 25 is formed on the SiON layer 23 extending through a window 23b therein to contact layer 19 of RTD 20. In this manner, an integrated device, comprising a RTD and an enhancement type HEMT mounted on the same substrate, is fabricated.

Figure 7:
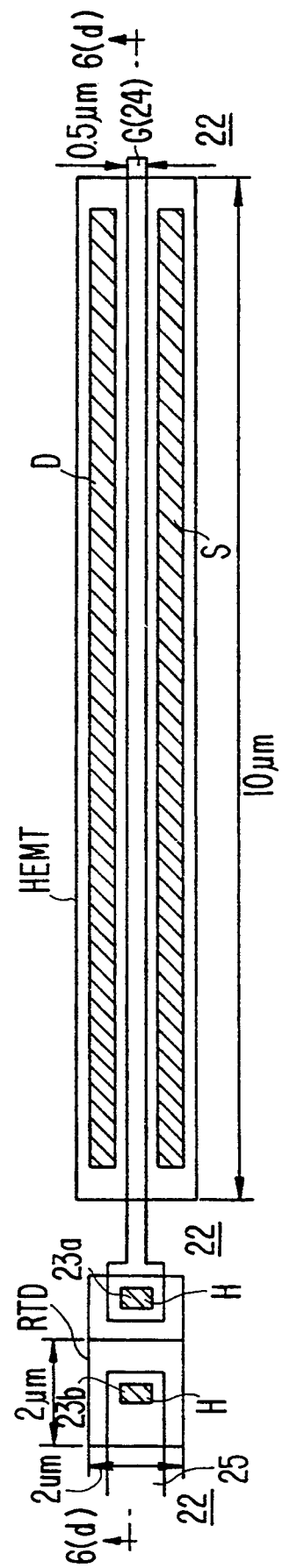
FIG. 7 is an enlarged plan view showing the integrated device fabricated by the processes of FIGS. 6(a)–6(d), FIG. 7 further illustrating a cross-sectional line 6(d)–6(d) defining a plane in which the view of FIG. 6(d) is taken.

FIG. 7 illustrates the integrated device, comprising a RTD and an enhancement type HEMT, fabricated by the processes shown in FIGS. 6(a)–6(d). FIG. 6(d) in this regard is a cross-section (not to scale) in a plane through line 6(d)–6(d) in FIG. 7, both thereof illustrating, in common, the gate electrode 24 and the metal layer 25 and the respective windows 23a and 23b, FIG. 7 additionally illustrating the drain D and source S separated by the gate G(24); the designations 22 in FIG. 7 correspond to the location of the isolations region 22 in FIGS. 6(b) to 6(d). The enhancement type HEMT has a gate length of 0.5 μm, and a gate width of 10 μm. The RTD has a peak current of 2 mA, a valley current of 0.2 mA, and a valley voltage of 0.8 V.

Figure 8:
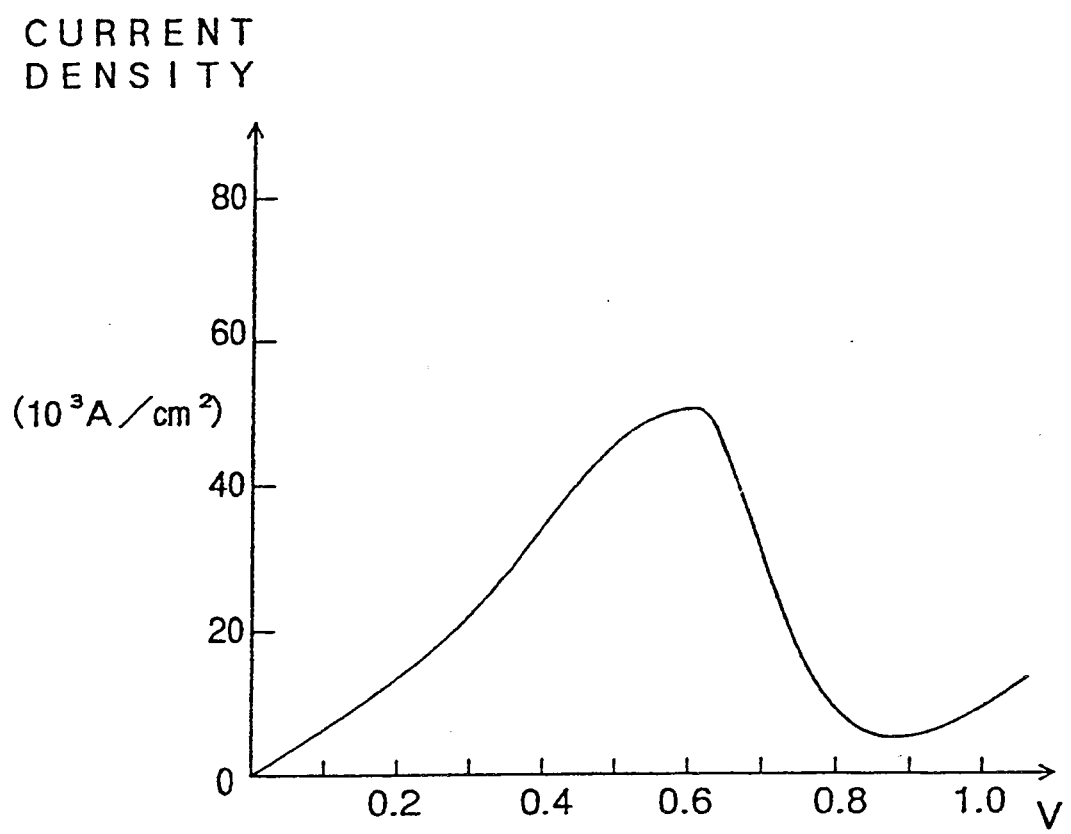
FIG. 8 is a graph showing a current-voltage characteristic of the RTD of FIG. 5.
Figure 9:
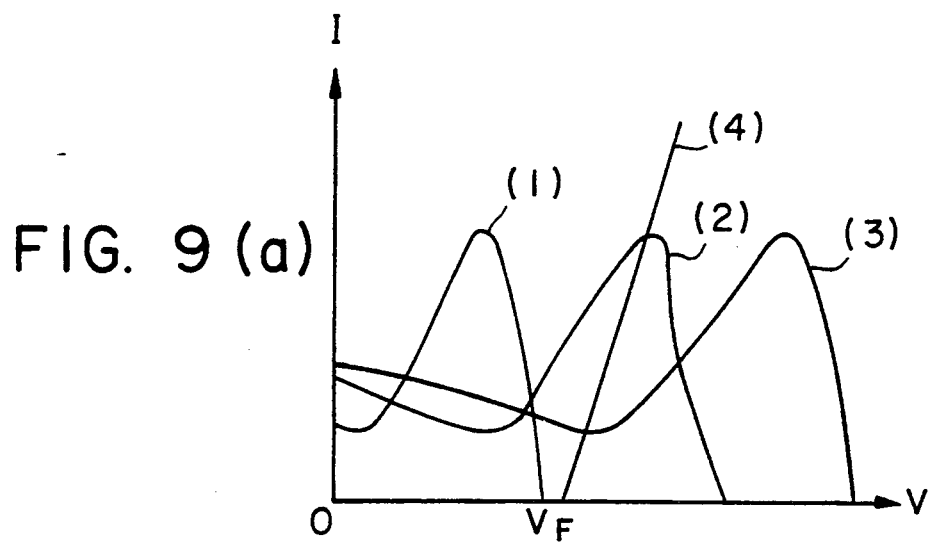
FIG. 9(a) is a graph showing the current-voltage characteristic of the RTD as $V_{OUT}$ is increased and a current-voltage characteristic of the HEMT.
FIG. 9(b) is a graph showing a resultant current-voltage characteristic of the RTD and the HEMT.
Figure 9:
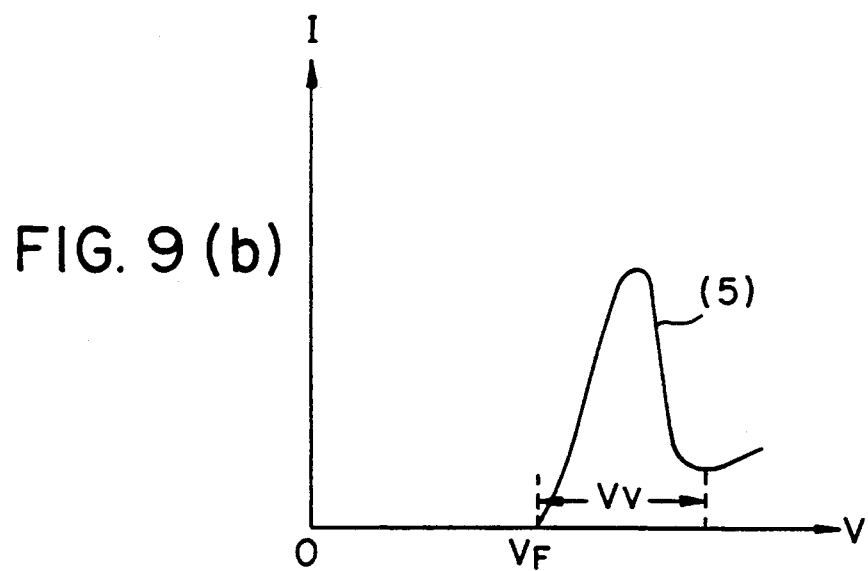

FIG. 8 shows a current-voltage characteristic of the RTD. The electrostatic capacity of the RTD when it is operated is $3 \times 10^{-7}$ F/cm$^2$ to $4 \times 10^{-7}$ F/cm$^2$ and thus is large, as compared with the gate capacity of $1 \times 10^{-7}$ F/cm$^2$ to $2 \times 10^{-7}$ F/cm$^2$ of the HEMT. As shown in FIG. 8, in the forward direction, the current first increases to a maximum value at a voltage of about 0.6 V, then decreases to a minimum value at a voltage of about 0.85 V. Also, as an input voltage to the RTD is increased, the peak voltage of the I-V characteristic is shifted in the right direction of FIG. 8, as shown by the curves (1), (2) and (3) in FIG. 9(a). More particularly, when the output voltage $V_{OUT}$ from the first inverter 2a is $V_{OUT1} < V_{OUT2} < V_{OUT3}$, the I-V characteristic of the RTD 5b is represented by the curves (1), (2) and (3) respectively. In FIG. 9(a), (4) represents the I-V characteristic of the HEMT 4b in the gate forward direction.

FIG. 9(b) schematically illustrates a resultant I-V characteristic (5) of the RTD 5b that is obtained by plotting the intersecting point between the I-V characteristic (4) of FIG. 9(a) and the I-V characteristic of the RTD 5b as the value of $V_{OUT}$ is increased.

As shown in FIG. 4, the intersecting point between the load curve (1) of the HEMT 3a and the resultant I-V characteristic (5) of the RTD 5b and the HEMT 4b is an operating point, and the high logic level signal output voltage $V_{OH}$ becomes approximately the sum of $V_F$ and the valley voltage $V_V$ of the RTD 5b. As a consequence, the logic amplitude (i.e., of $V_{OH}$) is increased by the valley voltage $V_V$ as compared with the logic amplitude (i.e., of $V_{OH}$) of the conventional logic circuit (see, $V_{OH}$ in FIG. 2), and is substantially identical with the power supply voltage $V_{DD}$ (as seen in FIG. 4). The current at that time is the valley current $I_V$ of the RTD 5b, as shown in FIG. 4, and is on the order of 1/10 to 1/20 of $I_{L1}$ of FIG. 2, so the stand-by electric power of the first inverter 2a at its high level state can correspondingly is reduced relatively thereto in an amount of from 1/10 to 1/20 thereof.

Figure 1:
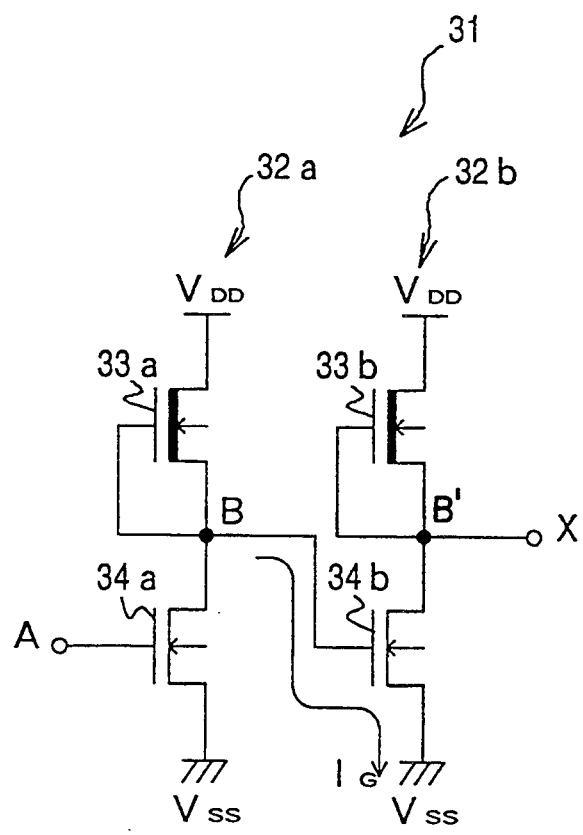
FIG. 1 is a schematic view showing a conventional logic circuit using a depletion type N-channel FET with a Schottky gate and an enhancement type N-channel FET with a Schottky gate.
Figure 2:
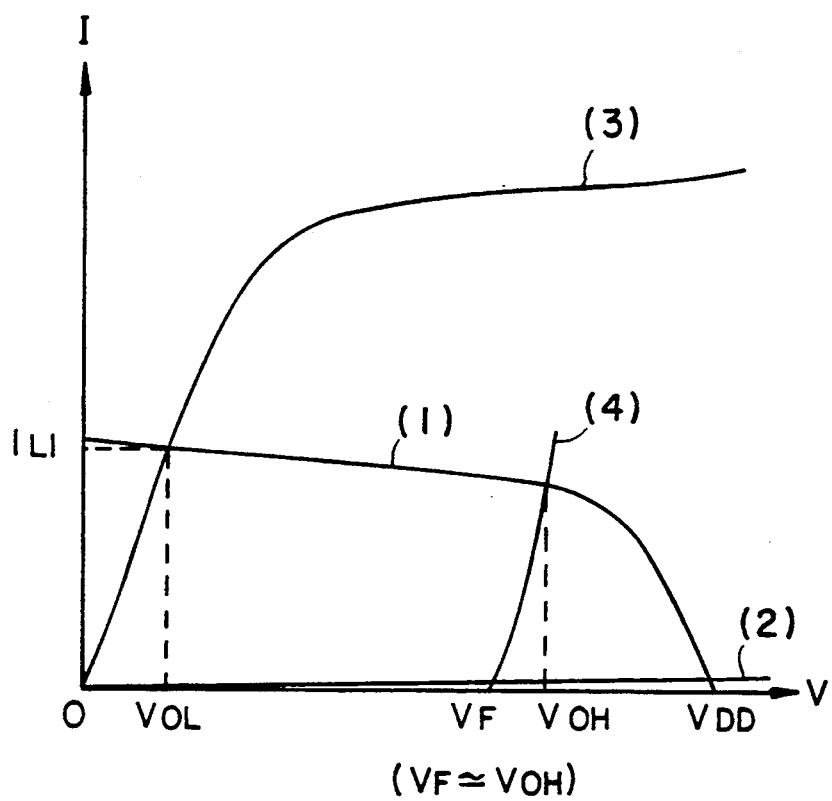
FIG. 2 is a graph showing the respective current-voltage characteristics of the depletion type N-channel FET and the enhancement type N-channel FET.

Therefore, in the embodiment of FIG. 5, as shown by comparison of FIGS. 2 and 4, by decreasing the peak voltage of the resultant I-V characteristic curve (5) and increasing the intersecting point between the curves (1) and (5) by $V_V$, from $V_F$, the output high logic signal voltage $V_{OH}$, becomes approximately $V_F + V_V$ and the logic amplitude and noise margin are increased. In addition, the gate current during stand-by time (at a logic high state) is greatly reduced, to the value $I_{V(H1)}$ as shown in FIG. 4, so the power consumption is reduced.

Figure 10:
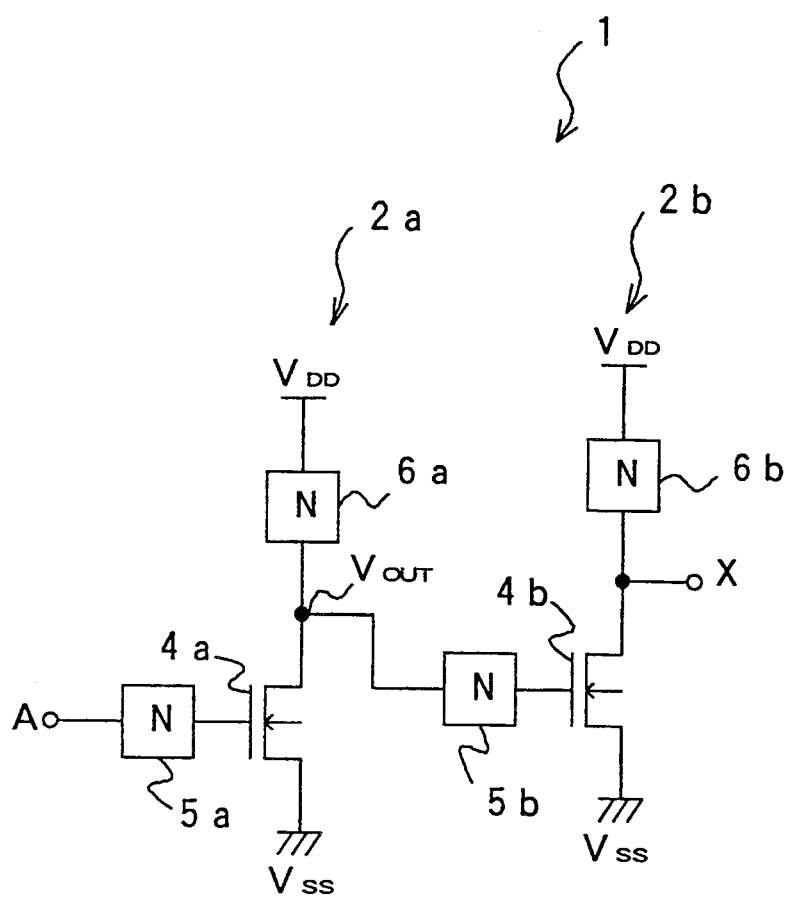
FIG. 10 is a schematic view showing another embodiment of the present invention.

FIG. 10 schematically illustrates another embodiment of the present invention. Many of the parts of the embodiment of FIG. 10 are identical to corresponding parts of the embodiment of FIG. 5 and the same reference numerals are applied to the corresponding parts.

Figure 11:
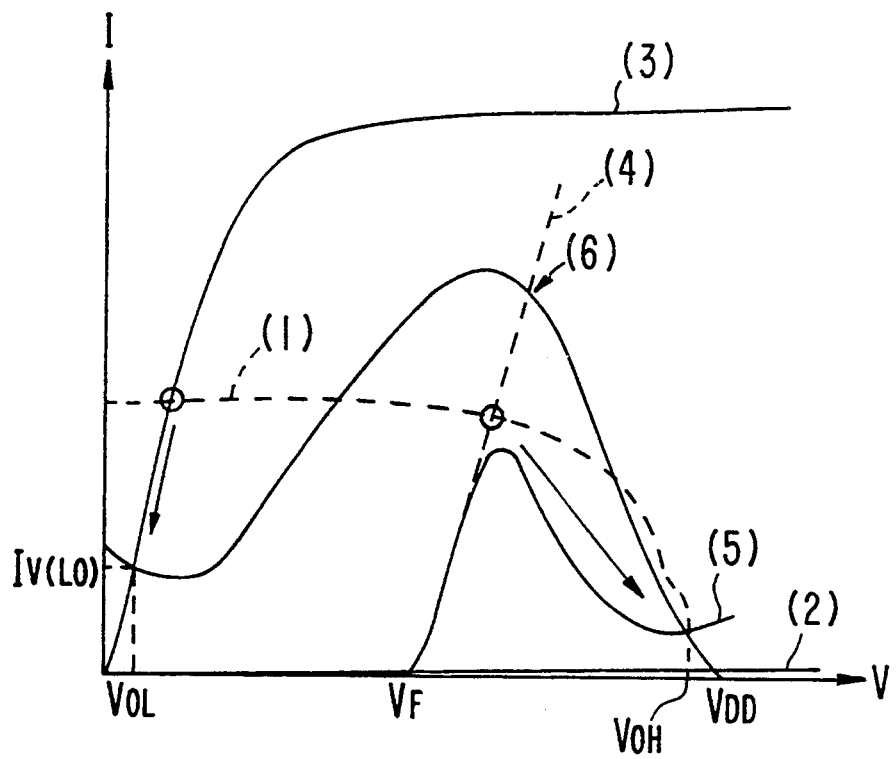
FIG. 11 is a graph showing the current-voltage characteristics of the RTD and the HEMT of FIG. 10.

In this embodiment of FIG. 10, the depletion type HEMT 3a of the first inverter 2a of FIG. 5 is replaced with a RTD 6a, which can be fabricated on the drain region of the enhancement type HEMT, and the depletion type HEMT 3b of the second inverter 2b of FIG. 5 is replaced with a RTD 6b. This embodiment is shown in FIG. 12, modified from FIG. 7, by the simple expedient of connecting the metal layer 24 to the drain region D of the HEMT. The FIG. 10 embodiment is characterized in that a stand-by current at a logic low state is improved, in addition to the improvement in stand-by current at a logic high state as is obtained by the embodiment of FIG. 5. As shown in FIG. 11, the intersecting point between the load curve (6) of the RTD 6a and the I-V characteristic (3) of the HEMT 4a is an operating point, so the gate current $I_{V(LO)}$ during a stand-by time (at a logic low state) is greatly reduced (1/5 to 1/10) and the power consumption is decreased. Therefore, in the embodiment of FIG. 10, the power consumption is further reduced.

While the subjection invention has been described with relation to a logic circuit using HEMTs, it is not limited to that specific logic circuit. For example, the invention is applicable to a logic circuit using other compound semiconductor devices having a Schottky gate, such as SiMESFET and GaAsMESFET.

What I claim is:

1. A logic circuit having high and low potential power supply terminals, an input terminal and an output terminal and comprising:
   at least one inverter stage having an output node and comprising:
      a load element having a first end connected to the high potential power supply terminal and a second end connected to the output node,
      an enhancement type N-channel field-effect transistor having a Schottky gate, a drain connected to the output node, and thereby to the second end of the load element, and a source connected to the low-potential power supply terminal,
      gate-current control means, having a negative resistance characteristic, connecting the input terminal to the Schottky gate of the enhancement type N-channel field-effect transistor, for controlling the level of gate current flowing through the enhancement type N-channel field-effect transistor; and
   the input and output terminals of the logic circuit being connected respectively to the gate-current control means and the output node of the at least one inverter stage.

2. A logic circuit as recited in claim 1, further comprising at least first and second said inverter stages, the input terminal of the logic circuit being connected to the gate-current control means of the first logic circuit, the output node of the first inverter stage being connected to the gate-current control means of the second inverter stage, and the output node of the second inverter stage being connected to the output terminal of the logic circuit.

3. A logic circuit as recited in claim 1, wherein the gate-current control means comprises a resonant tunneling diode.

4. A logic circuit as recited in claim 1, wherein the gate-current control means comprises an Esaki diode.

5. A logic circuit as recited in claim 1, wherein the load element comprises a depletion type N-channel field-effect transistor having a Schottky gate.

6. A logic circuit as recited in claim 1, wherein the load element comprises a resonant tunneling diode.

7. An integrated device comprising:
a substrate;
at least first and second semiconductor layers formed on the substrate and patterned to define electrically isolated first and second regions of the at least first and second layers;
an enhancement type N-channel field-effect transistor formed in said first region of said first and second semiconductor layers on said substrate and having a Schottky gate and a drain;
a resonant tunneling diode comprising plural additional semiconductor layers stacked on the second region of the at least first and second semiconductor layers, the resonant tunneling diode being connected to a selected one of the gate and the drain of the field effect transistor.

8. An integrated device as recited in claim 7, wherein the first and second regions are isolated by a doped channel extending between and surrounding the first and second regions.

9. An integrated device as recited in claim 7, wherein, in the first region, the first and second semiconductor layers define an interface therebetween, the first layer defining a channel layer of the field effect transistor at the interface with the second layer.

10. An integrated device as recited in claim 7, wherein the resonant tunneling diode is connected to the gate of the field effect transistor.

11. An integrated device as recited in claim 7, wherein the resonant tunneling diode is connected to the drain of the field effect transistor.

* * * * *

UNITED STATES PATENT AND TRADEMARK OFFICE
CERTIFICATE OF CORRECTION

PATENT NO. : 5,336,949
DATED : August 9, 1994
INVENTOR(S) : MIMURA

It is certified that error appears in the above-indentified patent and that said Letters Patent is hereby corrected as shown below:

On drawing sheet,

In Fig. 4, sheet 4 of 12, change "$V_{CH}$ ($\approx V_F + V_V$)" to --$V_{OH'}$ ($\approx V_F + V_V$)--.

Col. 1, line 32, change "invert" to --inverter--;
line 33, change "$I_{D1}$" to --$I_{L1}$--.

Figure 3:
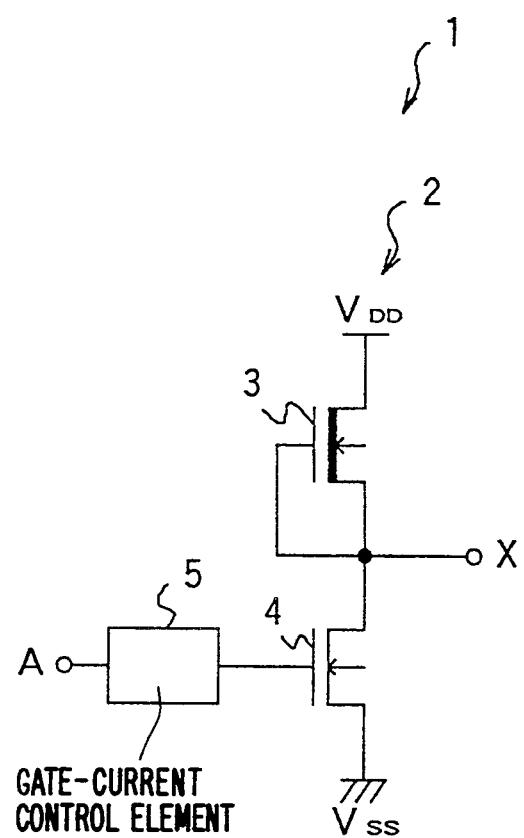
FIG. 3 is a circuit schematic used to explain the principles of the present invention.

Col. 3, line 37, after "FIG.3" insert --,--.

Col. 5, line 38, change "$V_{OUT}$from" to --$V_{OUT}$ from--;
line 53, change "$V_F$and" to --$V_F$ and--;
line 63, delete "can".

Signed and Sealed this

Thirty-first Day of January, 1995

Attest:

BRUCE LEHMAN

Attesting Officer     Commissioner of Patents and Trademarks